US007491653B1

(12) United States Patent
Papasouliotis et al.

(10) Patent No.: US 7,491,653 B1
(45) Date of Patent: *Feb. 17, 2009

(54) METAL-FREE CATALYSTS FOR PULSED DEPOSITION LAYER PROCESS FOR CONFORMAL SILICA LAMINATES

(75) Inventors: George D. Papasouliotis, Sunnyvale, CA (US); Seon-Mee Cho, San Jose, CA (US); Ron Rulkens, Milpitas, CA (US); Mihai Buretea, San Francisco, CA (US); Dennis M. Hausmann, Los Gatos, CA (US); Michael Barnes, San Ramon, CA (US)

(73) Assignee: Novellus Systems, Inc., San Jose, CA (US)

(*) Notice: Subject to any disclaimer, the term of this patent is extended or adjusted under 35 U.S.C. 154(b) by 489 days.

This patent is subject to a terminal disclaimer.

(21) Appl. No.: 11/318,268

(22) Filed: Dec. 23, 2005

(51) Int. Cl.
*H01L 21/469* (2006.01)
*H01L 21/31* (2006.01)

(52) U.S. Cl. .......... 438/778; 257/E21.17; 257/E21.546; 438/787

(58) Field of Classification Search .......... 257/E21.17, 257/E21.546; 438/778, 787
See application file for complete search history.

(56) References Cited

U.S. PATENT DOCUMENTS

| 5,314,724 | A | 5/1994 | Tsukune et al. |
| 5,525,550 | A | 6/1996 | Kato |
| 5,527,561 | A | 6/1996 | Dobson |
| 5,597,395 | A | 1/1997 | Bocko et al. |
| 5,705,028 | A | 1/1998 | Matsumoto |
| 5,985,770 | A | 11/1999 | Sandhu et al. |
| 6,030,881 | A | 2/2000 | Papasouliotis et al. |
| 6,064,104 | A | 5/2000 | Omid-Zohoor et al. |
| 6,102,993 | A | 8/2000 | Bhandari et al. |
| 6,133,160 | A | 10/2000 | Komiyama et al. |
| 6,184,108 | B1 | 2/2001 | Omid-Zohoor et al. |

(Continued)

FOREIGN PATENT DOCUMENTS

JP  5-308071 A  11/1993

(Continued)

OTHER PUBLICATIONS

"Atomic Layer Deposition of Metal Oxide Thin Films," A thesis presented by Dennis Michael Hausmann, Harvard University, 186 pages, Jul. 2002.

(Continued)

*Primary Examiner*—Asok K Sarkar
(74) *Attorney, Agent, or Firm*—Weaver Austin Villeneuve & Sampson LLP

(57) ABSTRACT

A metal- and metalloid-free nanolaminate dielectric film can be formed according to a pulsed layer deposition (PDL) process. A metal- and metalloid-free compound is used to catalyze the reaction of silica deposition by surface reaction of alkoxysilanols. Films can be grown at rates faster than 30 nm per exposure cycle. The invention can be used for the deposition of both doped (e.g., PSG) and undoped silicon oxide films. The films deposited are conformal, hence the method can accomplish void free gap-fill in high aspect ratio gaps encountered in advanced technology nodes (e.g., the 45 nm technology node and beyond), and can be used in other applications requiring conformal dielectric deposition.

28 Claims, 8 Drawing Sheets

U.S. PATENT DOCUMENTS

| | | | |
|---|---|---|---|
| 6,184,143 | B1 | 2/2001 | Ohashi et al. |
| 6,300,219 | B1 | 10/2001 | Doan et al. |
| 6,316,063 | B1 | 11/2001 | Andideh et al. |
| 6,335,261 | B1 | 1/2002 | Natzle et al. |
| 6,352,943 | B2 | 3/2002 | Maeda et al. |
| 6,352,953 | B1 | 3/2002 | Seki et al. |
| 6,372,669 | B2 | 4/2002 | Sandhu et al. |
| 6,479,404 | B1 * | 11/2002 | Steigerwald et al. ........ 438/781 |
| 6,503,330 | B1 | 1/2003 | Sneh et al. |
| 6,504,233 | B1 | 1/2003 | Gorczyca et al. |
| 6,511,539 | B1 | 1/2003 | Raaijmakers |
| 6,531,377 | B2 | 3/2003 | Knorr et al. |
| 6,534,395 | B2 | 3/2003 | Werkhoven et al. |
| 6,534,802 | B1 | 3/2003 | Schuegraf |
| 6,540,838 | B2 | 4/2003 | Sneh et al. |
| 6,551,339 | B2 | 4/2003 | Gavronsky |
| 6,551,399 | B1 | 4/2003 | Sneh et al. |
| 6,586,349 | B1 | 7/2003 | Jeon et al. |
| 6,624,091 | B2 | 9/2003 | Yuan |
| 6,780,789 | B1 | 8/2004 | Yu et al. |
| 6,784,101 | B1 | 8/2004 | Yu et al. |
| 6,802,944 | B2 | 10/2004 | Ahmad et al. |
| 6,861,334 | B2 | 3/2005 | Raaijmakers et al. |
| 6,867,152 | B1 | 3/2005 | Hausmann et al. |
| 6,903,005 | B1 | 6/2005 | Marsh |
| 6,908,862 | B2 | 6/2005 | Li et al. |
| 6,949,481 | B1 | 9/2005 | Halliyal et al. |
| 6,984,591 | B1 | 1/2006 | Buchanan et al. |
| 7,097,878 | B1 | 8/2006 | Rulkens et al. |
| 7,129,189 | B1 | 10/2006 | Hausmann et al. |
| 7,148,155 | B1 | 12/2006 | Tarafdar et al. |
| 7,163,899 | B1 * | 1/2007 | Cho et al. ................... 438/758 |
| 7,202,185 | B1 | 4/2007 | Hausmann et al. |
| 7,223,707 | B1 | 5/2007 | Papasouliotis et al. |
| 7,288,463 | B1 * | 10/2007 | Papasouliotis ............... 438/431 |
| 2001/0049205 | A1 | 12/2001 | Sandhu et al. |
| 2003/0015764 | A1 | 1/2003 | Raaijmakers et al. |
| 2003/0092241 | A1 | 5/2003 | Doan et al. |
| 2003/0129828 | A1 | 7/2003 | Cohen et al. |
| 2003/0134741 | A1 | 7/2003 | Weisbeck et al. |
| 2003/0157781 | A1 | 8/2003 | Macneil et al. |
| 2004/0004247 | A1 | 1/2004 | Forbes et al. |
| 2004/0025787 | A1 | 2/2004 | Selbrede et al. |
| 2004/0043149 | A1 | 3/2004 | Gordon et al. |
| 2004/0043569 | A1 | 3/2004 | Ahn et al. |
| 2004/0044127 | A1 | 3/2004 | Okubo et al. |
| 2004/0079728 | A1 | 4/2004 | Mungekar et al. |
| 2004/0102031 | A1 | 5/2004 | Kloster et al. |
| 2004/0203254 | A1 | 10/2004 | Conley et al. |
| 2004/0206267 | A1 | 10/2004 | Sambasivan et al. |
| 2004/0222490 | A1 | 11/2004 | Raaijmakers et al. |
| 2004/0247787 | A1 | 12/2004 | Mackie et al. |
| 2005/0054213 | A1 | 3/2005 | Derderian et al. |
| 2005/0112282 | A1 | 5/2005 | Gordon et al. |
| 2005/0239264 | A1 | 10/2005 | Jin et al. |
| 2005/0271813 | A1 | 12/2005 | Kher et al. |
| 2006/0038293 | A1 | 2/2006 | Rueger et al. |
| 2006/0087000 | A1 | 4/2006 | Okuno |
| 2006/0127578 | A1 | 6/2006 | Li et al. |

FOREIGN PATENT DOCUMENTS

| | | |
|---|---|---|
| JP | 2004-256479 | 9/2004 |
| WO | WO02/27063 | 4/2002 |
| WO | WO 03/083167 A1 | 10/2003 |

OTHER PUBLICATIONS

Hausmann et al., "Rapid Vapor Deposition of Highly Conformal Silica Nanolaminates," Science, vol. 308, Oct. 2002, 5 Pages.

Gordon et al., "A Kinetic Model for Step Coverage by Atomic Layer Deposition in Narrow Holes or Trenches", Chemical Vapor Deposition 2003, 9, No. 2, pp. 73-78.

U.S. Office Action mailed May 31, 2005, from U.S. Appl. No. 10/746,274.

Hausmann et al., "Plasma Treatments to Improve the Properties of Silica Thin Films Produced by a Rapid Vapor Deposition (RVD)", Novellus Systems, Inc., filed Dec. 23, 2000, U.S. Appl. No. 10/746,274, pp. 1-29.

Greer et al., "Method and Apparatus to Reduce the Frequency of Chamber Cleans in Rapid Vapor Deposition (RVD) of Silicon Oxide", Novellus Systems, Inc., filed Jul. 12, 2004, U.S. Appl. No. 10/890,376, pp. 1-25.

Hausmann et al., "Silica Thin Films Produced by Rapid Surface Catalyzed Vapor Deposition (RVD) Using a Nucleation Layer", Novellus Systems, Inc., filed Jun. 22, 2004, U.S. Appl. No. 10/875,158, pp. 1-25.

U.S. Office Action mailed Sep. 22, 2005, from U.S. Appl. No. 10/874,814.

Rulkens et al., "Mixed Alkoxy Precursors and Methods of Their Use for Rapid Vapor Deposition of $SiO_2$ Films", Novellus Systems, Inc., filed Jun. 22, 2004, U.S. Appl. No. 10/874,814, pp. 1-26.

U.S. Office Action mailed Jun. 23, 2005, from U.S. Appl. No. 10/874,808.

Hausmann et al., "Aluminum Phosphate Incorporation in Silica Thin Films Produced by Rapid Surface Catalyzed Vapor Deposition (RVD)", Novellus Systems, Inc., filed Jun. 22, 2004, U.S. Appl. No. 10/874,808, pp. 1-21.

Papsouliotis et al., "Method for Controlling Properties of Conformal Silica Nanolaminates Formed by Rapid Vapor Deposition", Novellus Systems, Inc., filed Jun. 22, 2004, U.S. Appl. No. 10/874,696, pp. 1-30.

Gaillard et al., "Silicon dioxide chemical vapor deposition using silane and hydrogen peroxide", Rapid Communications, J. Vac. Sci. Technol. B 14(4), Jul./Aug. 1996, pp. 2767-2769.

Beekmann, et al., "Properties of posttreated low κ flowfill™ films and their stability after etch, resist and polymer strip processes", Microelectronic Engineering 55(2001), pp. 73-79.

Robl et al., "Integration of Flowfill® and Forcefill® for cost effective via applications" Sep. 1999, pp. 77-83.

Penka et al., "Integration Aspects of Flowfill and Spin-on-Glass Process for Sub-0.35μm Interconnects", pp. 1-3.

Hockele et al., "Flowfill-Process as a New Concept for Inter-Metal-Dielectrics", Siemens AG, Semiconductor Group, 1998, pp. 235-238.

Roland et al., "Theoretical Modeling of $SiO_2$ Photochemical Vapor Deposition and Comparison to Experimental Results for Three Oxidant Chemistries: $SiH_4+O_2$, $H_2O/O_2$, and $H_2O_2$", Chem Mater 2001, 13, 2501-2510.

Roland et al., "Low Temperature Photochemical Vapor Deposition of SiO2 Using 172 nm Xe2* Excimer Lamp Radiation with Three Oxidant Chemistries: $O_2$, $H_2O/O_2$, and $H_2O_2$", Chem Mater 2001, 13, 2493-2500.

Moore et al., "Reaction of hydrogen peroxide with organosilanes under chemical vapour deposition conditions", J. Chem. Soc., Dalton Trans., 2000, 2673-2677.

Gaillard et al., "Effect of plasma and thermal annealing on chemical vapor deposition dielectrics grown using $SIH_4$-$H_2O_2$ gas mixtures", J. Vac. Sci. Technol. A 15(5), Sep./Oct. 1997, pp. 2478-2484.

Taylor et al., "Studies on the reaction between silane and hydrogen peroxide vapour; surface formation of planarized silica layers", J. Chem. Soc., Dalton Trans., 1997, pp. 1049-1053.

Xia et al., "High Aspect Ratio Trench Filling Using Two-Step Subatmospheric Chemical Vapor Deposited Borophosphosilicated Glass for <0.18 μm Device Application", Journal of The Electrochemical Society, 146 (5) 1884-1888 (1999).

Xia et al., "High Temperature Subatmospheric Chemical Vapor Deposited Undoped Silicated Glass—A Solution for Next Generation Shallow Trench Isolation", Journal of The Electrochemical Society, 146 (3) 1181-1185 (1999).

Arno et al., "Fourier Transform Infrared Characterization of Downstream Gas-Phase Species Generated by Tetraethylorthosilicate/

Ozone Atmospheric Pressure Reactions", Journal of The Electrochemical Society, 146 (1) 276-280 (1999).

Romet et al., "Modeling of Silicon Dioxide Chemical Vapor Deposition from Tetraethoxysilane and Ozone", Journal of The Electrochemical Society, 148 (2) G82-G90 (2001).

Ikeda et al., "The Effects of Alkoxy Functional Groups on Atomospheric-Pressure Chemical Vapor Deposition Using Alkoxysilane and Ozone", J. Electrochem. Soc., vol. 142, No. 5, May 1995, pp. 1659-1662.

"Customer A low k Gapfill Trikon FlowFill vs FHDP", Novellus Systems, Inc., pp. 1-12.

Ritala et al., "Atomic Layer Deposition", Handbook of Thin Films Materials, vol. 1, 2002, pp. 103-159.

Rulkens et al., "Methods for the Use of Alkoxysilanol Precursors for Vapor Deposition of $SiO_2$ Films", Novellus Systems, Inc., filed Dec. 23, 2004, U.S. Appl. No. 11/021,558, pp. 1-24.

Papasouliotis et al., "Dynamic Rapid Vapor Deposition Process for Conformal Silica Laminates", Novellus Systems, Inc., filed Dec. 30, 2004, U.S. Appl. No. 11/027,480, pp. 1-29.

Papasouliotis et al., "Multi-Step Nanolaminate Dielectric Deposition and Etch Back Gap Fill Process", Novellus Systems, Inc., filed Dec. 30, 2004, U.S. Appl. No. 11/026,563, pp. 1-28.

Rulkens et al., "Chamber and Chamber Surface Materials to Inhibit Deposition and Methods of Making Same", Novellus Systems, Inc., filed Dec. 23, 2004, U.S. Appl. No. 11/027,388, pp. 1-26.

Papasouliotis et al., "Methods for Forming High Density, Conformal, Silica Nanolaminate Films Via Pulsed Deposition Layer In Structures of Confined Geometry", Novellus Systems, Inc., filed Dec. 30, 2004, U.S. Appl. No. 11/026,284, pp. 1-24.

U.S. Office Action mailed Oct. 6, 2005, from U.S. Appl. No. 10/975,028.

Tarafdar et al., "Sequential Deposition/Anneal Film Densification Method", Novellus Systems, Inc., filed Oct. 26, 2004, U.S. Appl. No. 10/975,028, pp. 1-34.

Papasouliotis, George D., "Optimal Operation of Conformal Silica Deposition Reactors", Novellus Systems, Inc., U.S. Appl. No. 11/077,198, filed Mar. 9, 2005, pp. 1-32.

Papasouliotis, George D., "Optimal Operation of Conformal Silica Deposition Reactors", Novellus Systems, Inc., U.S. Appl. No. 11/077,108, filed Mar. 9, 2005, pp. 1-31.

Cho et al., "Hydroxyl Bond Removal and Film Densification Method for Oxide Films Using Microwave Post Treatment", Novellus Systems, Inc., U.S. Appl. No. 11/280,076, filed Nov. 15, 2005, pp. 1-27.

U.S. Office Action mailed Nov. 10, 2005, from U.S. Appl. No. 11/021,558.

U.S. Office Action mailed Dec. 30, 2005, from U.S. Appl. No. 11/026,284.

U.S. Office Action mailed Dec. 5, 2005, from U.S. Appl. No. 10/746,274.

U.S. Office Action mailed Dec. 7, 2005, from U.S. Appl. No. 10/874,808.

U.S. Office Action mailed Dec. 22, 2005, from U.S. Appl. No. 11/026,563.

Cho et al., "Localized Energy Pulse Rapid Thermal Anneal Dielectric Film Densification Method", Novellus Systems, Inc., U.S. Appl. No. 11/327,668, filed Jan. 5, 2006, pp. 1-28.

Papasouliotis et al., "Reactive Seam Healing Methods for Improving Film Integrity In Structures of Confined Geometry", Novellus Systems, Inc., U.S. Appl. No. 11/334,762, filed Jan. 17, 2006, pp. 1-24.

U.S. Office Action mailed Feb. 24, 2006, from U.S. Appl. No. 11/077,108.

U.S. Office Action mailed Mar. 24, 2006, from U.S. Appl. No. 10/975,028.

U.S. Office Action mailed Jul. 7, 2006, from U.S. Appl. No. 10/875,158.

U.S. Office Action mailed Sep. 27, 2006, from U.S. Appl. No. 11/021,558.

U.S. Office Action mailed Sep. 27, 2006, from U.S. Appl. No. 11/026,284.

U.S. Office Action mailed Sep. 29, 2006, from U.S. Appl. No. 11/027,480.

U.S. Office Action mailed Jan. 16, 2007, from U.S. Appl. No. 10/874,696.

U.S. Office Action mailed Mar. 21, 2007, from U.S. Appl. No. 11/414,459.

U.S. Office Action mailed Apr. 13, 2007, from U.S. Appl. No. 11/026,284.

U.S. Office Action mailed Mar. 23, 2007, from U.S. Appl. No. 11/021,558.

Papasouliotis et al., "Pulsed Deposition Layer Gap Fill With Expansion Material," Novellus Systems, Inc., U.S. Appl. No. 11/414,459, filed Apr. 28, 2006, pp. 1-28.

Papasouliotis et al., "Conformal Nanolaminate Dielectric Deposition and Etch Back Gap Fill Process and Apparatus," Novellus Systems, Inc., U.S. Appl. No. 11/524,502, filed Sep. 19, 2006, pp. 1-38.

U.S. Office Action mailed May 23, 2006, from U.S. Appl. No. 11/077,198.

U.S. Office Action mailed May 24, 2006, from U.S. Appl. No. 11/026,284.

U.S. Office Action mailed May 31, 2006, from U.S. Appl. No. 11/026,563.

U.S. Office Action mailed May 15, 2006, from U.S. Appl. No. 11/027,480.

U.S. Office Action mailed Apr. 25, 2006, from U.S. Appl. No. 11/021,558.

U.S. Office Action mailed May 8, 2006, from U.S. Appl. No. 11/327,668.

* cited by examiner

METAL-FREE CATALYSTS FOR PULSED DEPOSITION LAYER PROCESS FOR CONFORMAL SILICA LAMINATES

BACKGROUND OF THE INVENTION

This invention pertains to methods for forming thin dielectric films. More specifically, the invention pertains to methods of depositing a conformal film of dielectric material with a high degree of surface smoothness particularly suited to high aspect ratio gap fill applications in semiconductor device fabrication.

Conformal, uniform dielectric films have many applications in semiconductor manufacturing. In the fabrication of sub-micron integrated circuits (ICs) several layers of dielectric film are deposited. Four such layers are shallow trench isolation (STI), premetal dielectric (PMD), inter-metal dielectric (IMD) and interlayer dielectric (ILD). All four of these layers require silicon dioxide films that fill features of various sizes and have uniform film thicknesses across the wafer.

In particular, it is often necessary in semiconductor processing to fill a high aspect ratio gap with insulating material. As device dimensions shrink and thermal budgets are reduced, void-free filling of high aspect ratio (AR) spaces (AR>3.0:1) becomes increasingly difficult due to limitations of existing deposition processes. The deposition of doped or undoped silicon dioxide assisted by high density plasma CVD, a directional (bottom-up) CVD process, is the method currently used for high aspect ratio (AR) gap-fill. Evolving semiconductor device designs and dramatically reduced feature sizes have resulted in several applications where HDP processes are challenged in filling the high aspect ratio structures (AR>7:1) using existing technology (see, for example, U.S. Pat. No. 6,030,881). For structures representative of the 65 nm and 45 nm technology nodes, engineering the gap-fill process becomes structure dependent, hence the process requires re-optimization, a task of considerable complexity, every time a new structure needs to be filled.

An alternative to CVD is atomic layer deposition (ALD). ALD methods involve self-limiting adsorption of reactant gases and can provide thin, conformal dielectric films within high aspect ratio features. The ALD process involves exposing a substrate to alternating doses of, usually two, reactant gasses. As an example, if reactants A and B are first and second reactant gases for an ALD process, after A is adsorbed onto the substrate surface to form a saturated layer, B is introduced and reacts only with adsorbed B. In this manner, a very thin and conformal film can be deposited. One drawback, however, to ALD is that the deposition rates are very low. Films produced by ALD are also very thin (i.e., about one monolayer); therefore, numerous ALD cycles must be repeated to adequately fill a gap feature. These processes are unacceptably slow in some applications in the manufacturing environment.

Another more recently developed technique useful in gap fill and other dielectric deposition applications in semiconductor processing is referred to as pulsed deposition layer (PDL) processing, sometimes also referred to as rapid surface-catalyzed vapor deposition (RVD). PDL is similar to ALD in that reactant gases are introduced alternately over the substrate surface, but in PLD the first reactant A acts as a catalyst, promoting the conversion of the second reactant B to a film. In ALD the reaction between A and B is approximately stoichiometric, meaning that a monolayer of A can only react with a similar amount of B before the film-forming reaction is complete. The catalytic nature of A in PDL allows a larger amount of B to be added, resulting in a thicker film. Thus, PDL methods allow for rapid film growth similar to using CVD methods but with the film conformality of ALD methods.

Current PDL-type processes involve the use of a metal or metalloid containing catalyst. As an example of the use of PDL to deposit silicon dioxide on silicon, the first reagent can be trimethylaluminum (TMA) and the second tirs(pentoxy) silanol (TPOSL). The heated silicon substrate is first exposed to a dose of TMA, which is thought to react with the silicon surface to form a thin layer of surface-bound aluminum complex. Excess TMA is pumped or flushed from the deposition chamber. A large dose of TPOSL is then introduced. The aluminum complex catalyzes the conversion of the silanol to silicon oxide until the silanol is consumed, or the growing film covers or otherwise inactivates the catalytic complex. When excess silanol is used, the film growth is usually self-limiting and a thick and uniform film results. Unreacted silanol may now be removed from the chamber and the growth cycle repeated. Other metal-containing precursors that can be deposited to activate or reactivate the catalytic surface include, but are not limited to, precursors containing zirconium, hafnium, gallium titanium, niobium, tantalum, and their oxides or nitrides.

In front-end of line (FEOL) applications the metal content of the dielectric films is very tightly controlled, and the presence of metals in concentrations of 1-2% atomic may not be desirable. The metal or metalloid compound results in the formation of second phase (e.g., $Al_2O_3$ in the case of an Al-containing precursor) in PDL silicon oxide, which can affect film properties. Moreover, prior work in the field indicates a phosphorus incorporation scheme that implies that phosphorus concentration in the film will be increasing proportionally to that of the metal or metalloid. Since P-doped silica films contain typically >5 wt. % P, similar concentrations of metals/metalloids will be incorporated into the film, which is likely to impact subsequent process steps (CMP, contact etch, etc).

Therefore, a method is needed to eliminate the presence of metals and metalloid elements from the silica films (both doped and undoped), and at the same time maintain conformality, growth rate, and other film properties.

SUMMARY OF THE INVENTION

The present invention eliminates the need for a metal or metalloid comprising catalyst in a pulsed deposition layer (PDL) dielectric formation process, while maintaining film properties including conformality, growth rate, and dielectric material composition. The invention provides doped or un-doped PDL silica glass (silicon oxide) films with improved performance characteristics where metal content is disfavored and applies to IMD/ILD, PMD, and STI gap-fill, among other types of dielectric formation. A metal- and metalloid-free compound, is used to catalyze the reaction of silica deposition by surface reaction of alkoxysilanols. Films can be grown at rates faster than 30 nm per exposure cycle. The invention can be used for the deposition of both doped (e.g., PSG) and undoped silica (USG) films. The elemental composition of the films is that of silicon oxide. The films deposited are conformal, hence, the method can accomplish void free gap-fill in high aspect ratio gaps encountered in advanced technology nodes (e.g., the 45 nm technology node and beyond).

This method involves two principal, sequential operations: 1) exposing the substrate surface to a metal- and metalloid-free compound to form a catalytic layer; and 2) exposing the catalyst-activated substrate surface to a silicon-containing precursor. Operations 1) and 2) can be repeated a number of times, for example a total of 2-5 times, to build up a silica nanolaminate structure forming the completed metal and metalloid-free dielectric film. A preferred class of catalytic precursors are acidic compounds (e.g., an organic acid such as acetic acid ($CH_3COOH$) or an inorganic acid such as phosphoric acid ($H_3PO_4$). Furthermore, any suitable metal- and metalloid-free compound that can sufficiently adsorb onto or react with the substrate surface and prepare it to sufficiently react with the subsequently added silicon-containing precursor to form a dielectric layer that is more than a monolayer thick may be used. Other potential catalysts include other organic or inorganic acids, organic bases, salts, organophosphorus compounds and precursors to these.

Between operations, inert gas purges may be performed. Any suitable inert gas may be used. A typical purge lasts about 5 seconds. Additionally, there may be a post-deposition treatment to remove water from the deposited film.

In preferred embodiments of the invention, the substrate is a partially fabricated semiconductor wafer including shallow trench isolation (STI) features, over which the dielectric film is to be deposited.

Exposure to the catalytic precursor and the silicon-containing precursor may occur in different chambers in preferred embodiments of the invention. Further, additional precursor gases may be used.

DETAILED DESCRIPTION OF SPECIFIC EMBODIMENTS

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

Figure 1:
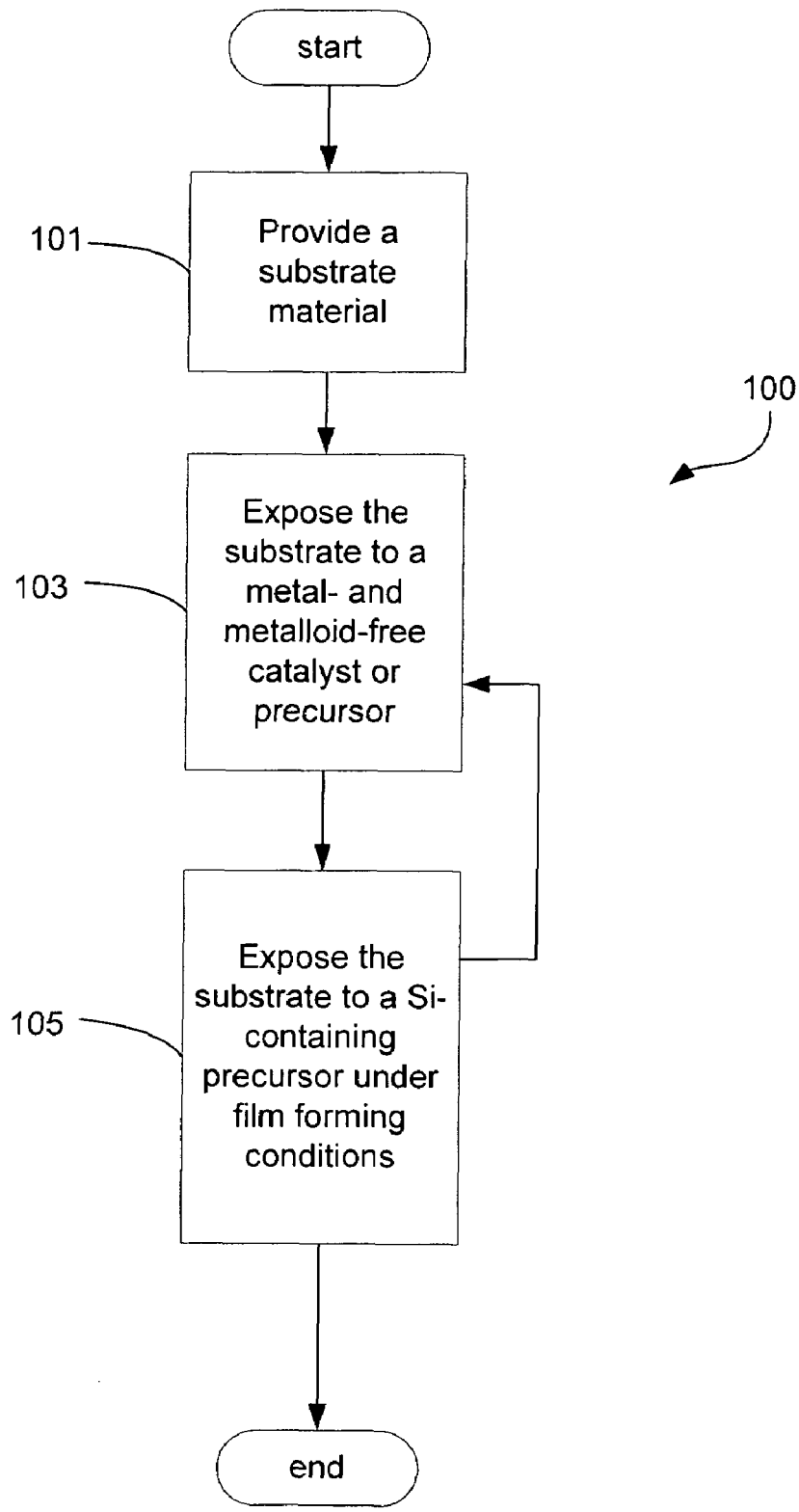
FIG. 1 depicts a process flow diagram illustrating relevant operations in a pulsed layer deposition (PDL) process to form a conformal dielectric film in accordance with the present invention.

The formation of silica films by a pulsed layer deposition (PDL) can be catalyzed by metal and metalloid-free compounds, such as acidic compounds. A specific example is phosphoric acid ($H_3PO_4$); several other examples are provided below. Referring to FIG. 1, a process flow diagram illustrating relevant operations in a pulsed layer deposition (PDL) process to form a conformal dielectric film in accordance with the present invention is shown.

The deposition process 100 begins with operation 101, wherein a substrate is placed into a deposition chamber. For many embodiments of the invention, the substrate is a semiconductor wafer. A "semiconductor wafer" as discussed in this document is a semiconductor substrate at any of the various states of manufacture/fabrication in the production of integrated circuits. As mentioned previously, one commercially important application of the present invention is in various dielectric gap-fill applications, such as filling of STI or PMD features. The process continues with operation 103, where a catalyst that does not contain a metal or metalloid element, or a precursor for such a compound (referred to herein alternatively as catalyst or catalytic precursor) is supplied into the deposition chamber so as to substantially saturate the substrate surface with the catalyst. Any compound or precursor that can sufficiently adsorb onto or react with the substrate surface and prepare it to sufficiently further react with the subsequently added silicon-containing precursor may be used. In addition, the catalyst or precursor should be capable of aiding the catalytic polymerization of the subsequently added silicon-containing precursor to produce a film thicker than a monolayer.

As indicated earlier, forming a catalyst-activated layer is a self-limiting process. Relevant process conditions can include substrate (e.g., wafer) temperature, reactor pressure, reactant partial pressure, and combinations thereof. Pressures can range broadly, e.g., between about 1 mTorr and 760 Torr. Typical pressures range between about 500 and 1250 mTorr and typical temperatures range between about 0 and 300° C., for example between about 20 and 250° C., such as 20, 50, 100, 200, 230 or 250° C. in various implementations. Flow rates of catalyst reactants can range broadly, e.g., between about 1 and 10000 sccm in the gas phase. Preferred gas phase flow rates of the catalyst range between about 1 and 100 sccm. Catalysts may also alternatively be delivered to the reactor and/or the substrate surface in the liquid phase. Suitable liquid phase delivery flow rates can be between 0.01 and 100 mL/min; or the liquid catalysts can be delivered to the substrate surface by dipping, painting, spraying, etc. Suitable liquid phase catalyst concentrations can vary widely, for example from about $10^{-3}$ to 12M, such as about 0.01, 0.1, 1, 2, 5, 7 or 10M. Exposure times suitable for forming a saturated layer are typically only seconds, e.g., about 1 to 10 seconds. In some embodiments, for example, an exposure time of about 2 seconds or 5 seconds is found to be sufficient. Given the directions and parameters provided herein, one of skill in the art will be able to readily determine the appropriate conditions for effective use of a given catalyst in accordance with the present invention.

After a metal and metalloid-free catalyst-activated layer is formed an inert gas is preferably used to purge the substrate surface and reaction chamber (not shown). It should be noted that introduction of a purge gas can be used in between operations wherein contact between reactant gases should be avoided, including between each process cycle. Further, the purge gas can be flowed continuously during any of these operations and a period or periods between the operations. Purge gases are generally inert. Examples include the noble gases (e.g., argon) and nitrogen. The reaction chamber may additionally be evacuated following inert gas purge.

Returning to FIG. 1, following the chamber purge, the metal and metalloid-free catalyst-activated substrate surface is exposed to a silicon-containing precursor gas under conditions selected for growth of a conformal dielectric film (105). Suitable process conditions are noted above. In one preferred embodiment, a wafer temperature of about 200° C. is used for the deposition of the dielectric film.

Any suitable silicon-containing precursor that can sufficiently adsorb onto and react with the catalytic layer to form a dielectric film may be used. In addition, the silicon-containing precursor should be capable of polymerization when exposed to the adsorbed catalyst to produce a film thicker than a monolayer. Preferred silicon-containing precursors include silanols and silanediols, such as alkoxysilanols, alkyl alkoxysilanols, alkyl alkoxysilanediols and alkoxysilanediols. Examples of suitable precursors include tris(tert-butoxy)silanol $((C_4H_9O)_3SiOH)$, tris(tert-pentoxy)silanol$((C_5H_{11}O)_3SiOH)$, di(tert-butoxy)silandiol $((C_4H_9O)_2Si(OH)_2)$ and methyl di(tert-pentoxy)silanol.

Process parameters during exposure to the silicon-containing precursor including temperature, gas pressure, flow rate, dose and exposure times will vary depending on the types of precursors used, reaction chamber configuration and desired final film thickness, deposition rate and dielectric characteristics, among other variables. As noted, the process conditions in accordance with the present invention are dynamic, at first selected to optimize surface smoothness, then selected to optimize conformality and deposition rate. Generally, temperatures can range from about 200 to 300° C. A typical initial deposition temperature is about 200° C.; and 230° C. for subsequent deposition stages. Pressures can range broadly, e.g., between about 1 mTorr and 760 Torr. Typical pressures range between about 500 mTorr and 20 Torr. Flow rates of silicon-containing precursor gas can range broadly, e.g., between about 1 and 10000 sccm. Preferred flow rates of silicon-containing precursor gas range between about 200 and 1000 sccm. Exposure times can range broadly, e.g., between about 1 milliseconds and 200 seconds. Preferred exposure times typically range between about 10 and 60 seconds. The number of separate exposures to silicon-containing precursor will primarily depend upon the desired final film thickness. Typical numbers of silicon-containing precursor exposure cycles for a STI feature 0.1 micron in diameter range between about 2 and 4. Again, as with the temperature process condition, these other process conditions may be modulated alone or in combinations in the dynamic process of the invention in accordance with the parameters noted above.

While the invention is not limited to this theory of operation, as mentioned previously, it is believed that the catalyst is adsorbed onto or reacts with the substrate surface, and the accumulation of dielectric film is achieved via a polymerization process. The activated substrate surface layer can catalytically polymerize the silicon-containing precursor to produce growing chains of silica. After a period of growth determined by the substrate temperature, the silica polymer can "gel" or "cross-link" to form a solid silicon oxide. Thus, it is believed that the first PDL precursor forms a catalyst-activated surface. This could be accomplished by physical adsorption of the catalyst on the surface, in which case the active species in the catalyst itself, as delivered. It is likely that in some cases the catalyst will react chemically with the surface. In this scenario this surface becomes the actual active species in the silanol polymerization and gel formation. For example, phosphoric acid is envisioned to react with silanol moieties on the surface of the silicon wafer. This surface-bound phosphate can now further react with silanols resulting in a siloxane. After repeated insertions of silanol, silica-like chains grow and eventually gel at the elevated temperature.

Table 1 lists a number of metal- and metalloid-free compounds suitable as catalysts in a PDL process in accordance with the present invention. Note that these are not limited to acids, but include aprotic compounds with acidic character as well as organic bases and salts and organophosphorus compounds.

TABLE 1

List of Metal and Metalloid-Free Catalysts

| Catalyst | Example/structure |
|---|---|
| Organic acids | $CH_3COOH$, $CF3COOH$, $HCOOH$ |
| Anhydrides of organic acids | $(CH_3CO)_2O$ |
| Dialkylphosphates | 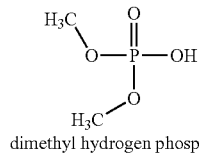<br>dimethyl hydrogen phosphate |
| Alkysphosphates | 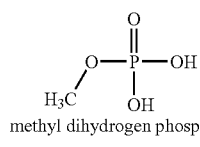<br>methyl dihydrogen phosphate |
| Phosphonic acids | 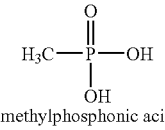<br>methylphosphonic acid |
| Phosphinic acids | 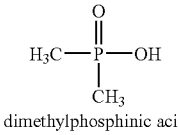<br>dimethylphosphinic acid |
| Phosphorus oxides | $P_2O_3$, $P_2O_5$ |
| Alkylamines (primary, secondary or tertiary) | Triethylamine, $(CH_3CH_2)_3N$ |
| Arylamines | 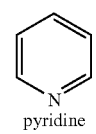<br>pyridine |
| Alky/arylboronic acids | 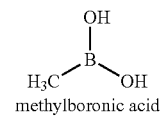<br>methylboronic acid |
| Sulphonic acids | 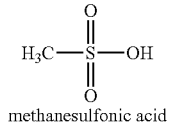<br>methanesulfonic acid |
| Water | $H_2O$ |

TABLE 1-continued

List of Metal and Metalloid-Free Catalysts

| Catalyst | Example/structure |
| --- | --- |
| Ammonium salts | Tetraethylammonium chloride, $(CH_3CH_2)_4N^+Cl^-$ |
| Phosphonitrile compounds | $TMSO(PCl_2\!=\!\!N)_n\!-\!P(O)Cl_2$ |
| Boron triflates | $(CH_3CH_2)_3B(CF_3COOH)_3$ |
| Inorganic acids | H2SO4, HCl, HNO3, HF, HBr, HI |
| Anhydrides of inorganic acids | SO3, N2O5, NO, SO2 |

It should be noted that one skilled in the art may choose to introduce the precursor to a catalyst into a deposition chamber instead of the actual catalyst, if it is advantageous to do so. The precursor can then be transformed into the catalyst by any number of convenient means, such as chemical, thermal or light-activated reactions. As an example, $P_2O_5$ may be delivered to a wafer. Following reaction with water $P_2O_5$ may be converted to phosphoric acid. The water may be present in the film or may be separately delivered to the processing chamber. In another example, acetic anhydride may be converted to acetic acid, also by reaction with water Table 1, above, also contains examples of compounds that can be used as precursors to active catalysts.

As indicated by the arrow in FIG. 1, operations 103 and 105 can be repeated a number of times, for example a total of 2-5 times, to build up a silica nanolaminate structure forming the completed metal and metalloid-free dielectric film. For example, the operations might be repeated until a dielectric layer of a desired thickness is obtained and/or a gap is filled by the deposited dielectric.

Other Embodiments

This method applies to the deposition of silica (USG). However, this method may also be used for depositing doped silica films, such as fluorine-doped silicate glass (FSG), phosphosilicate glass (PSG), boro-phospho-silicate glass (BPSG), or carbon doped low-k materials. The use of a P-containing catalyst can lead to the formation of P-doped silica films. In a similar manner, the use of appropriate compounds can lead to the formation of F, B, N, or C-doped silicon oxide films. Examples of corresponding compounds can be $CF_3COOH$, $H_2BO_3$, and organic acids.

Other deposition co-reactants, such as silanols with varying substituents (e.g., more than one kind of alkoxy substituent) may be used to improve the film characteristics. For an example, see U.S. patent application Ser. No. 10/874,814, filed Jun. 22, 2004, titled "Mixed Alkoxy Precursors and Methods of Their Use for Rapid Vapor Deposition of $SiO_2$ Films."

Apparatus

Figure 2:
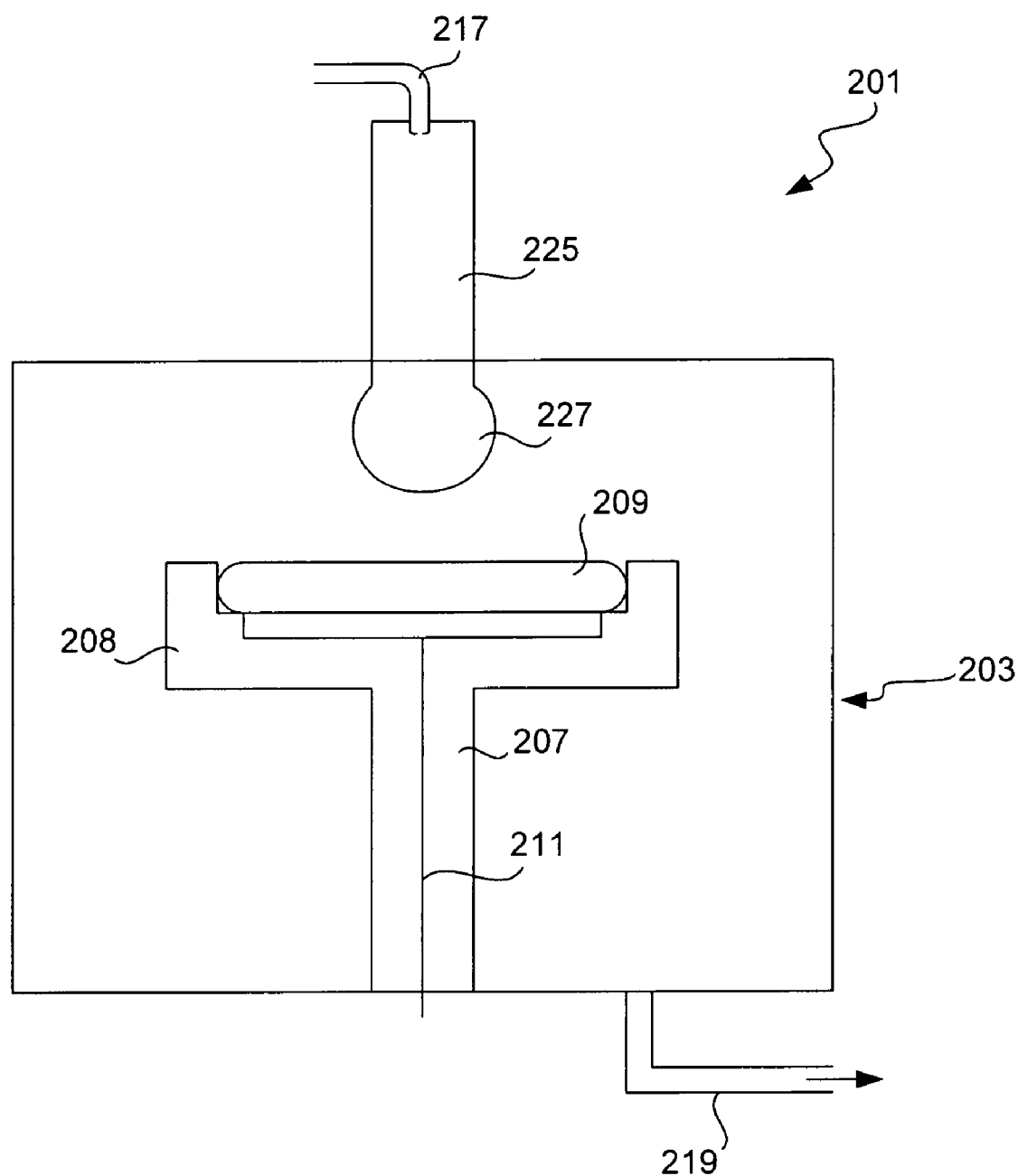
FIG. 2 depicts a schematic diagram showing the basic features of a PDL reactor module suitable for practicing the current invention.

FIG. 2 is a block diagram depicting some components of a suitable reactor for performing dielectric deposition using a PDL process in accordance with one embodiment of this invention. Note that this apparatus is only an example of suitable apparatus for deposition in accordance with this embodiment of the present invention. Many other apparatuses and systems, including a multi-chambered apparatus, may be used.

As shown, a reactor 201 includes a process chamber 203, which encloses components of the reactor and serves to contain the reactant gases and provide and area to introduce the reactant gases to substrate 209. The chamber walls may be made of or plated with any suitable material, generally a metal that is compatible with the deposition and associated processes conducted therein. In one example, the process chamber walls are made from aluminum. Within the process chamber, a wafer pedestal 207 supports a substrate 209. The pedestal 207 typically includes a chuck 208 to hold the substrate in place during the deposition reaction. The chuck 208 may be an electrostatic chuck, a mechanical chuck or various other types of chuck as are available for use in the industry and/or research.

A heat transfer subsystem including resistive heaters and/or lines 211 for supplying a heat transfer fluid to the pedestal 207 controls the temperature of pedestal 207. In some embodiments, the heat transfer fluid comprises water or another liquid. The reactant gases, as well as inert gases during purge, are introduced individually into the reactor via inlet 217. A showerhead 227 may be used to distribute the gas flow uniformly in the process reactor. Reactant gases are introduced through a gas supply inlet mechanism including orifices. There may be multiple reactant gas tubes and inlets. A vacuum pump connected to outlet 219 can draw out gases between PDL cycles.

Various details of the apparatus have been omitted for clarity's sake, and various design alternatives may be implemented.

EXAMPLES

The following example provides details relating to performance advantages of the present invention. It should be understood the following is representative only, and that the invention is not limited by the detail set forth in this example.

The feasibility of the method was demonstrated using phosphoric acid ($H_3PO_4$) as a catalyst for a metal and metalloid-free pulsed layer deposition (PDL) process for dielectric film deposition in accordance with the present invention. Si substrates were exposed to the 7.1M phosphoric acid for 5 seconds and subsequently to TPOSL (tris t-pentoxy silanol) under conditions used for the deposition of PDL oxide (230° C., 20 Torr reactor pressure).

Figure 3:
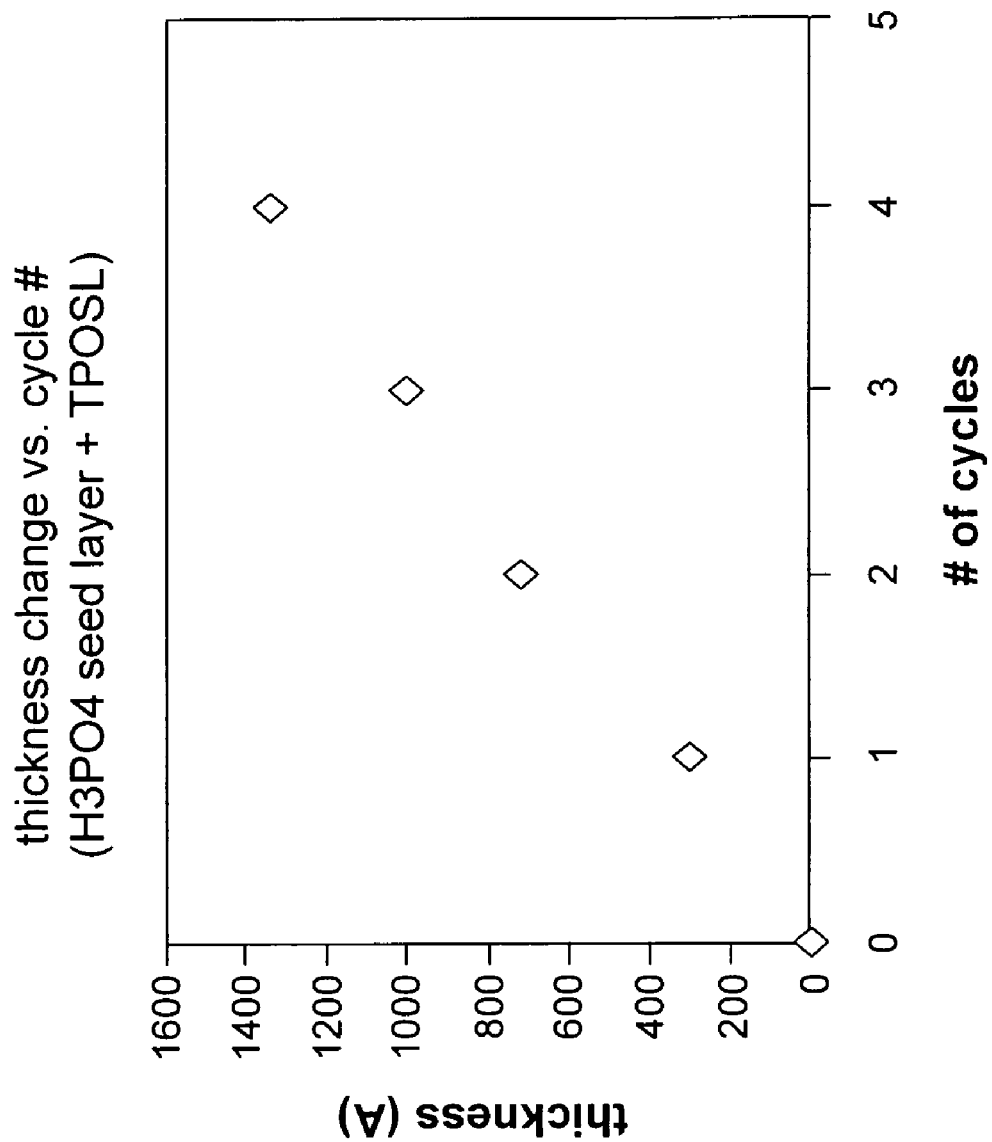
FIG. 3 depicts a plot of film growth (A) vs. number of $H_3PO_4$/TPOSL cycles for a pulsed layer deposition (PDL) process to form a conformal dielectric film in accordance with the present invention.

Film growth as a function of exposure cycles is shown in FIG. 3. The average growth rate is 334 Å/cycle. Baseline experiments showed no film growth without the presence of the acid, even after long exposure (8 hrs) to 20 Torr of TPOSL/$N_2$ mixtures.

Figure 4:
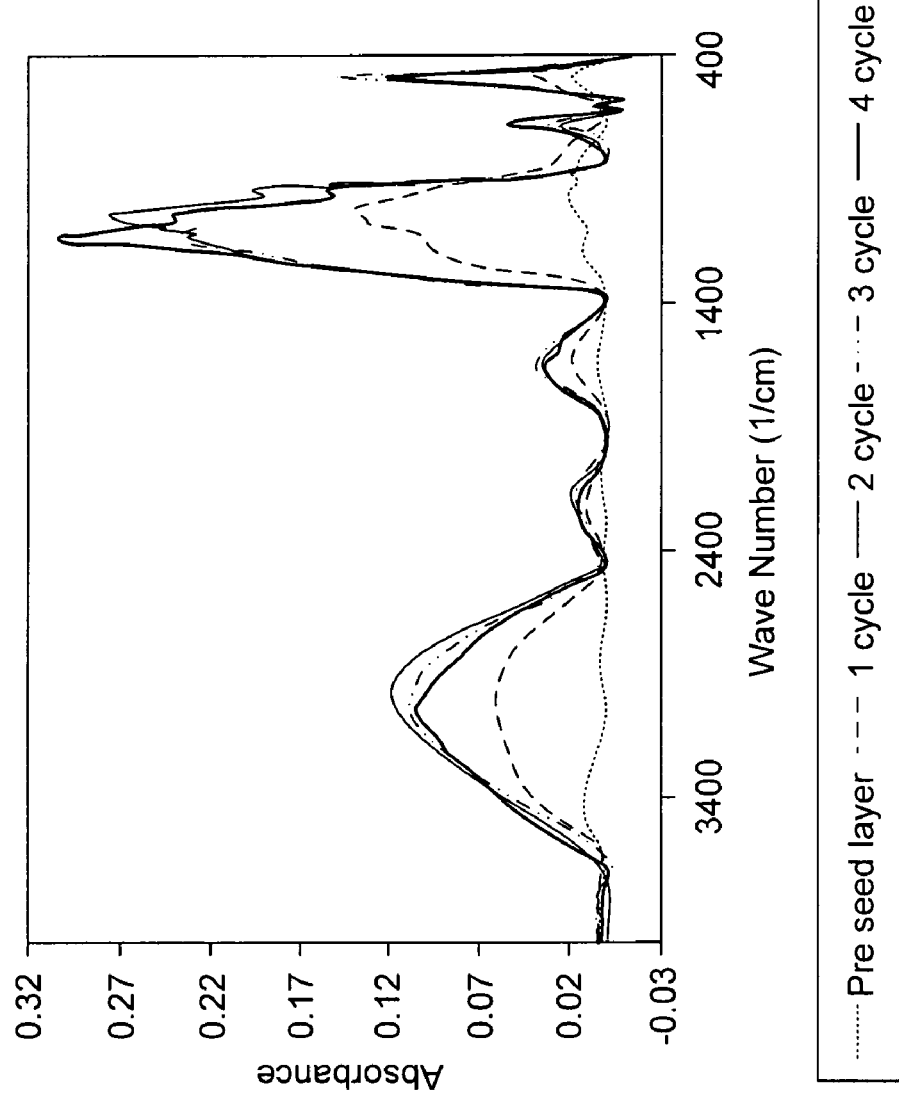
FIG. 4 depicts a plot of FTIR spectra of dielectric films deposited by a metal and metalloid-free pulsed layer deposition (PDL) process in accordance with the present invention.

FIG. 4 shows the FTIR spectra of the deposited film. The intensity of the Si—O stretch and P=O peaks increases as function of exposure cycle indicating the presence of a thicker film on the substrate. The result is consistent with the measurements illustrated in FIG. 3. The FTIR spectrum of the as deposited film shows also the presence of Si—OH bonds (at around 3650 cm$^{-1}$), which is typical of PDL oxide films.

Figure 5:
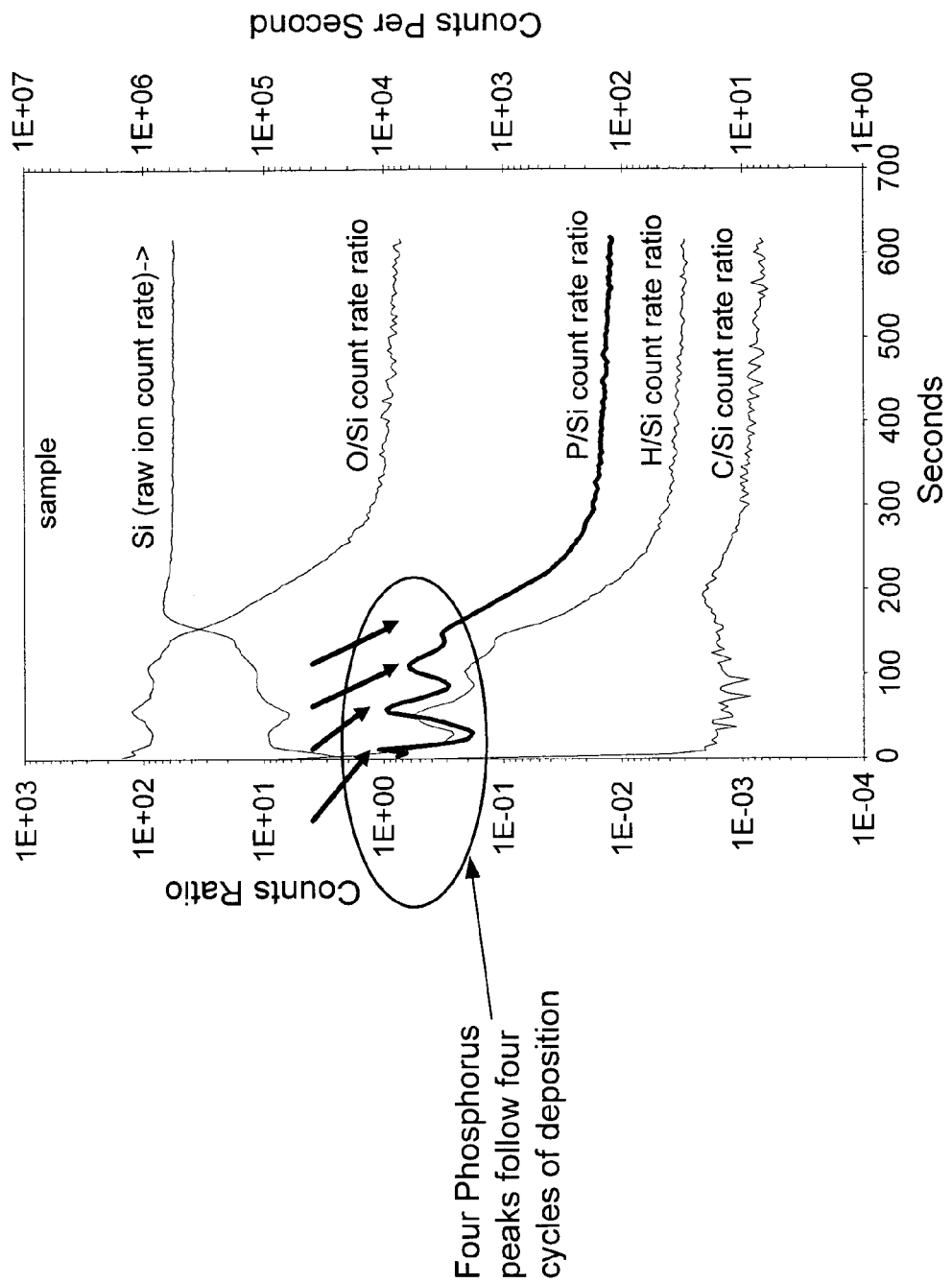
FIG. 5 depicts a SIMS plot of the dielectric film deposited by a metal and metalloid-free pulsed layer deposition (PDL) process showing four discreet phosphorus peaks corresponding to the number of $H_3PO_4$ exposures.

FIG. 5 depicts the secondary ion mass spectrometry (SIMS) profile of the deposited film showing four discreet phosphorus peaks corresponding to the number of $H_3PO_4$ exposures.

Figure 6:
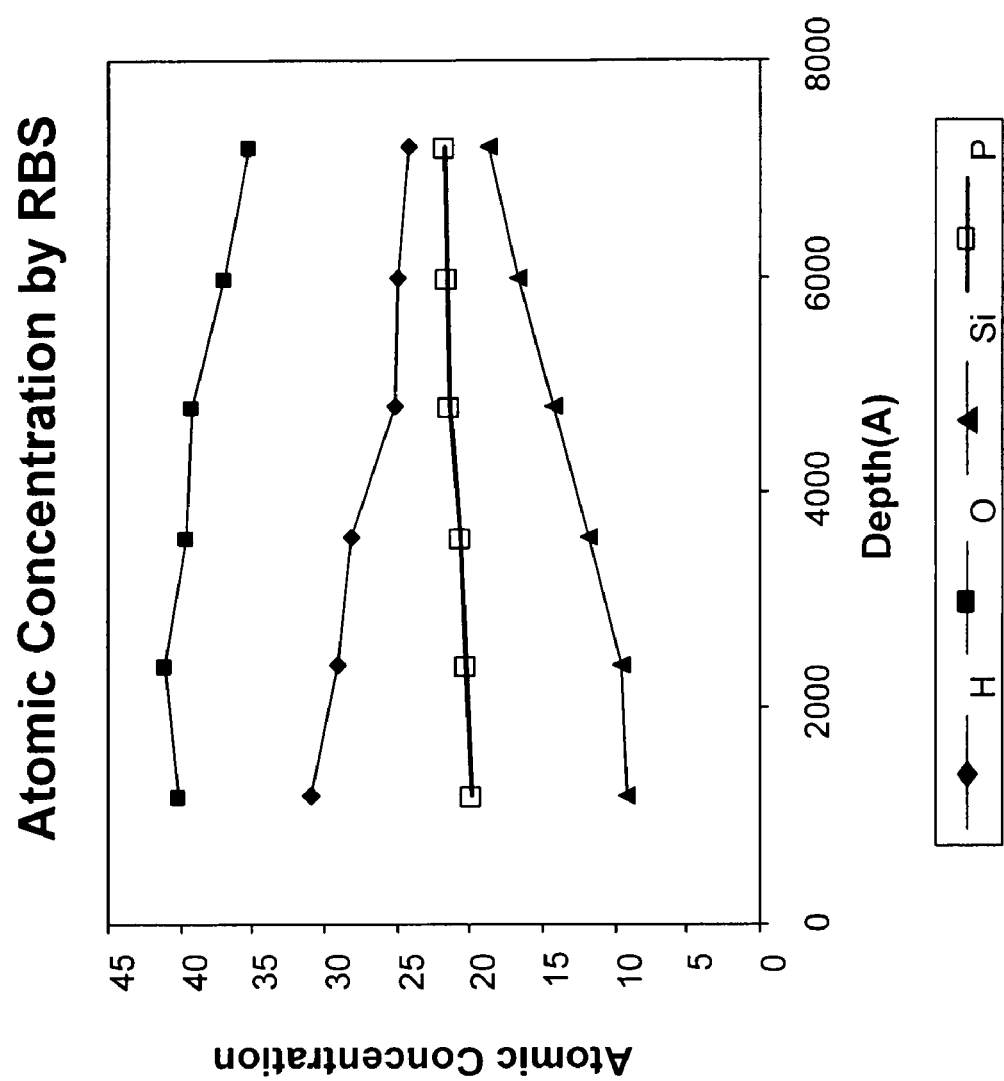
FIG. 6 depicts a plot of overall atomic concentration (RBS) of P in the dielectric film.

FIG. 6 illustrates that the overall atomic concentration of P in the film, calculated by Rutherford backscattering (RBS), is 20%, which implies that concentrations used in typical PSG films (e.g., 5-7% wt) are easily achievable.

Figure 7:
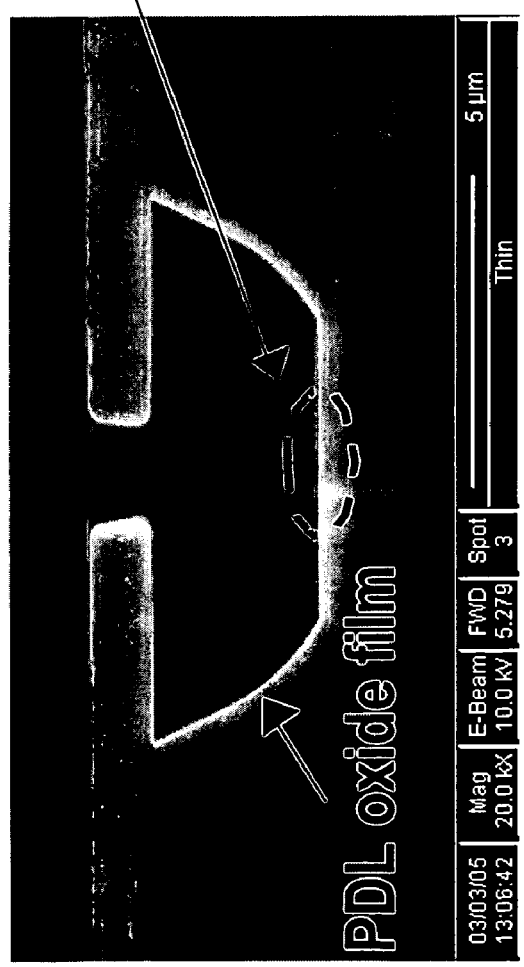
FIG. 7 depicts a scanning electron microscope (SEM) image of a cantilever structure used in growth mechanism characterization experiments.
Figure 8:
FIG. 8 depicts the same structure as in FIG. 7 following deposition of a dielectric film by a metal and metalloid-free pulsed layer deposition (PDL) process in accordance with the present invention ($H_3PO_4$/TPOSL exposures).

The conformality of a film deposited by a metal- and metalloid-free catalyzed PDL process was tested using cantilever structures. A scanning electron microscope (SEM) image of a typical structure with a minimal amount of PDL oxide deposition is shown in FIG. 7. In FIG. 8, the same structure is shown following deposition of a dielectric film by a metal and metalloid-free pulsed layer deposition (PDL) process in accordance with the present invention (H₃PO₄/TPOSL exposures). Film grows conformally in all areas of the structure. This indicates the absence of line of sight contributions to film growth, and implies that the film can be used in high aspect ratio gap-fill applications.

CONCLUSION

The disclosed method applies to the gap fill deposition of metal- and metalloid-free silica films using the pulsed deposition layer (PDL) process. It pertains to IMD, STI and PMD applications. While described primarily with reference to silicon dioxide herein, the method may also be used for depositing doped silica films, such as FSG, PSG, BPSG, SiON, or carbon doped low-k materials. Films can be grown at rates faster than 30 nm per exposure cycle. The films deposited are conformal, hence the method can accomplish void free gap-fill in high aspect ratio gaps encountered in advanced technology nodes (e.g., the 45 nm technology node and beyond), and can be used in other applications requiring conformal dielectric deposition.

Although the foregoing invention has been described in some detail for purposes of clarity of understanding, it will be apparent that certain changes and modifications may be practiced within the scope of the appended claims. It should be noted that there may be alternative ways of implementing the present invention. Also, while the invention has been described primarily in terms of preparing integrated circuits, it is not so limited. Accordingly, the present embodiments are to be considered as illustrative and not restrictive, and the invention is not to be limited to the details given herein, but may be modified within the scope and equivalents of the appended claims.

The entire disclosures of all references cited herein are incorporated by reference for all purposes.

It is claimed:

1. A method of forming a dielectric film, the method comprising:
    (a) exposing a substrate surface to a metal and metalloid-free catalyst to form a catalytic layer on the substrate surface; and
    (b) exposing the substrate surface to a silicon-containing precursor gas selected from the group consisting of at least one silanol, at least one silanediol and combinations thereof;
    whereby the film is formed.

2. The method of claim 1, further comprising repeating (a) and (b) at least once.

3. The method of claim 1, wherein the metal- and metalloid-free catalyst is a compound that can sufficiently adsorb onto or react with the substrate surface and prepare it to react with the subsequently added silicon-containing precursor to form a dielectric layer more than a monolayer thick.

4. The method of claim 3, wherein the catalyst is selected from the group consisting of organic acids, inorganic acids, organic bases, salts, organophosphorus compounds, precursors to these, and combinations thereof.

5. The method of claim 4, wherein the catalyst is selected from the group consisting of organic acids, anhydrides of organic acids, dialkylphosphates, alkysphosphates, phosphonic acids, phosphinic acids, phosphorus oxides, alkylamines (primary, secondary or tertiary), arylamines, alkyl/arylboronic acids, sulphonic acids, water, ammonium salts, phosphonitrile compounds, boron triflates, inorganic acids, anhydrides of inorganic acids, and combinations thereof.

6. The method of claim 5, wherein the catalyst is selected from the group consisting of:

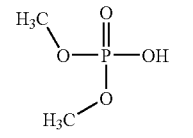
dimethyl hydrogen phosphate

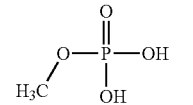
methyl dihydrogen phosphate

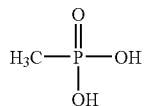
methylphosphonic acid

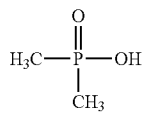
dimethylphosphinic acid

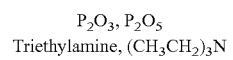

pyridine

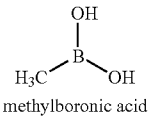
methylboronic acid

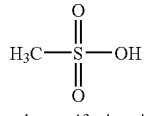
methanesulfonic acid

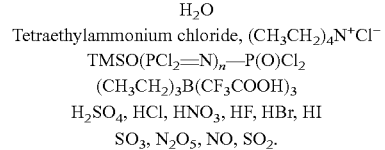

7. The method of claim 6, wherein the catalyst is phosphoric acid.

8. The method of claim 1, wherein the silanol and a silanediol is at least one of an alkoxysilanol, alkyl alkoxysilanol, alkyl alkoxysilanediol or alkoxysilanediol.

9. The method of claim 1, wherein the silicon-containing precursor is selected from the group consisting of tris(tert-butoxy)silanol (($C_4H_9O)_3SiOH$), tris(tert-pentoxy) silanol (($C_5H_{11}O)_3SiOH$), di(tert-butoxy silandiol (($C_4H_9O)_2Si(OH)_2$) and methyl di(tert-pentoxy)silanol and combinations thereof.

10. The method of claim 1, wherein the silicon-containing precursor is selected from the group consisting of tris(tert-butoxy)silanol (($C_4H_9O)_3SiOH$) and tris(tert-pentoxy)silanol(($C_5H_{11}O)_3SiOH$).

11. The method of claim 1, wherein the substrate is a partially fabricated semiconductor wafer.

12. The method of claim 11, wherein the dielectric film is deposited over one or more gaps in the partially fabricated semiconductor wafer.

13. The method of claim 11, wherein the dielectric film is deposited over a feature selected from the group consisting of shallow trench isolation (STI), inter-metal dielectric (IMD), inter-level dielectric (ILD), and pre-metal dielectric (PMD) features in the partially fabricated semiconductor wafer.

14. The method of claim 1, wherein the metal and metalloid free catalyst compound is applied in the gas state.

15. The method of claim 1, wherein the metal and metalloid free catalyst compound is applied in the liquid state.

16. The method of claim 1, wherein the substrate temperature is about 20° C. to 250° C.

17. The method of claim 16, wherein the substrate temperature is about 230° C.

18. The method of claim 1, wherein the firm is formed at a reactor pressure of about 10-30 Torr.

19. The method of claim 18, wherein the film is formed at a reactor pressure of about 20 Torr.

20. A method of filling a gap on a partially formed semiconductor wafer surface with a dielectric film, the method comprising:
 (a) exposing a substrate surface to a metal and metalloid-free catalyst to form a catalytic layer on the substrate surface;
 (b) exposing the substrate surface to a silicon-containing precursor gas selected from the group consisting of at least one silanol, at least one silanediol and combinations thereof such that a dielectric film is formed in the gap; and
 (c) repeating (a) and (b) until the gap is filled.

21. The method of claim 20, wherein the metal- and metalloid-free catalyst is a compound that can sufficiently adsorb onto or react with the substrate surface and prepare it to react with the subsequently added silicon-containing precursor to form a dielectric layer more than a monolayer thick.

22. The method of claim 21, wherein the catalyst is selected from the group consisting of organic acids, anhydrides of organic acids, dialkylphosphates, alkysphosphates, phosphonic acids, phosphinic acids, phosphorus oxides, alkylamines (primary, secondary or tertiary), arylamines, alkyl/arylboronic acids, sulphonic acids, water, ammonium salts, phosphonitrile compounds, boron triflates, inorganic acids, anhydrides of inorganic acids, and combinations thereof.

23. The method of claim 20, wherein the catalyst is selected from the group consisting of organic acids, inorganic acids, organic bases, salts, organophosphorus compounds, precursors to these, and combinations thereof.

24. The method of claim 23, wherein the catalyst is selected from the group consisting of:

($CH_3CO)_2O$

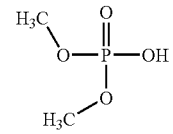

dimethyl hydrogen phosphate

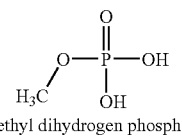

methyl dihydrogen phosphate

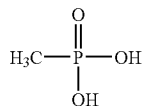

methylphosphonic acid

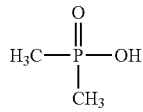

dimethylphosphinic acid

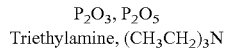

Triethylamine, $(CH_3CH_2)_3N$

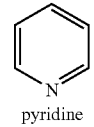

pyridine

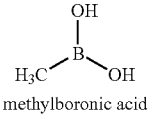

methylboronic acid

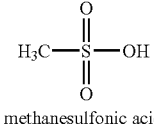

methanesulfonic acid

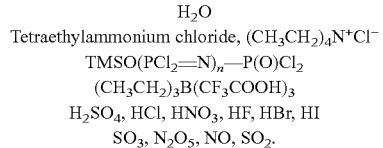

25. The method of claim 24, wherein the catalyst is phosphoric acid.

26. The method of claim 20, wherein the silicon-containing precursor is selected from the group consisting of tris(tert-butoxy)silanol (($C_4H_9O)_3SiOH$) and tris(tert-pentoxy) silanol(($C_5H_{11}O)_3SiOH$).

27. A method of forming a dielectric film, the method comprising:
(a) exposing a substrate surface to a metal and metalloid-free catalyst to form a catalytic layer on the substrate surface, the catalyst selected from the group consisting of:

---

CH₃COOH, CF₃COOH, HCOOH
(CH₃CO)₂O

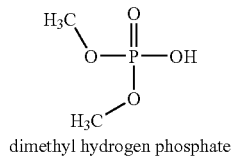
dimethyl hydrogen phosphate

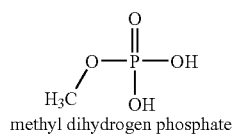
methyl dihydrogen phosphate

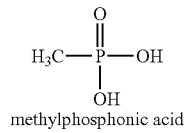
methylphosphonic acid

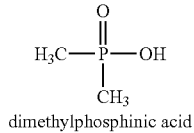
dimethylphosphinic acid

P₂O₃, P₂O₅
Triethylamine, (CH₃CH₂)₃N

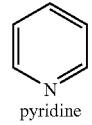
pyridine

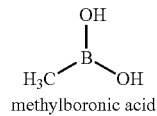
methylboronic acid

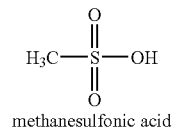
methanesulfonic acid

H₂O
Tetraethylammonium chloride, (CH₃CH₂)₄N⁺Cl⁻
TMSO(PCl₂═N)ₙ—P(O)Cl₂
(CH₃CH₂)₃B(CF₃COOH)₃
H₂SO₄, HCl, HNO₃, HF, HBr, HI
SO₃, N₂O₅, NO, SO₂;

---

; and
(b) exposing the substrate surface to a silicon-containing precursor gas;
whereby the film is formed.

28. The method of claim 27, wherein the catalyst is phosphoric acid.

* * * * *